(12) United States Patent
Kagaya

(10) Patent No.: US 7,400,791 B2
(45) Date of Patent: Jul. 15, 2008

(54) SEMICONDUCTOR ELEMENT MOUNTING BOARD AND OPTICAL TRANSMISSION MODULE

(75) Inventor: Osamu Kagaya, Tokyo (JP)

(73) Assignee: Opnext Japan, Inc., Yokohama-Shi (JP)

( * ) Notice: Subject to any disclaimer, the term of this patent is extended or adjusted under 35 U.S.C. 154(b) by 0 days.

(21) Appl. No.: 11/622,511

(22) Filed: Jan. 12, 2007

(65) Prior Publication Data

US 2007/0248363 A1   Oct. 25, 2007

(30) Foreign Application Priority Data

Apr. 19, 2006   (JP) ............................... 2006-115147

(51) Int. Cl.
  *G02B 6/12* (2006.01)
(52) U.S. Cl. ......................................... 385/14; 385/129
(58) Field of Classification Search .................... 385/14, 385/129
  See application file for complete search history.

(56) References Cited

U.S. PATENT DOCUMENTS 5,781,578 A * 7/1998 Takagi ........................ 372/50.1
2005/0275053 A1  12/2005 Shimizu et al.
2007/0177883 A1 * 8/2007 Kagaya et al. .............. 398/202

FOREIGN PATENT DOCUMENTS

| DE | 197 00 261 | 2/1998 |
|---|---|---|
| EP | 1 605 295 | 12/2005 |
| EP | 1 617 279 | 1/2006 |
| JP | 2001-257412 | 9/2001 |
| JP | 2001-308130 | 11/2001 |
| JP | 2005-353910 | 12/2005 |

* cited by examiner

*Primary Examiner*—Jennifer Doan
(74) *Attorney, Agent, or Firm*—Antonelli, Terry, Stout & Kraus, LLP.

(57) ABSTRACT

An optical transmission module of the invention uses a semiconductor chip forming an optical modulator integrated laser on a semi-insulating semiconductor board. An input transfer line and an anode electrode of an optical modulator element are connected by a first bonding wire. The anode electrode of the optical modulator element and one of the ends of a terminal resistor element are connected by a second bonding wire. A cathode electrode of the optical modulator element and the other end of the terminal resistor element are connected by a third bonding wire. The cathode electrode of the optical modulator element and a ground electrode are connected by a fourth bonding wire. A joint portion between the first bonding wire and the input transfer line is arranged on an opposite side to a joint portion between the fourth bonding wire and the ground electrode while interposing the semiconductor chip between them.

18 Claims, 14 Drawing Sheets

TO OTHER LEAD

Lgnd = 0.2 nH

Lgnd = 0.2 nH

SEMICONDUCTOR ELEMENT MOUNTING BOARD AND OPTICAL TRANSMISSION MODULE

INCORPORATION BY REFERENCE

The present application claims priority from Japanese application JP2006-115147 filed on Apr. 19, 2006, the content of which is hereby incorporated by reference into this application.

BACKGROUND OF THE INVENTION

This invention relates to an optical transmission module for optical communication, and particularly to an optical transmission module used for a transmission portion of an optical transceiver having a high transfer rate (10 Gbit/s, for example).

An optical transmission module using a semiconductor laser is one of the key devices of transceivers for optical fiber transfer. An operation speed of optical transmission modules has been improved with recent popularization of broadband networks and optical transmission modules having a transfer rate of up to 10 Gbit/s have now been used widely. The optical transmission modules suitable for this application are strongly required to possess small size and low cost and to achieve high transmission waveform quality.

Optical transmission modules directed to improve high frequency characteristics are disclosed in JP-A-2001-257412 (corresponding to U.S. Pat. No. 6,823,145) and JP-A-2001-308130 (corresponding to U.S. Pat. No. 6,507,111). These patent references JP-A-2001-257412 and JP-A-2001-308130 describe the optical transmission modules that simultaneously reduce a small signal reflection coefficient (S11) at a characteristic impedance of 50 Ohms on the high frequency input side and secure a 3 dB band in a small signal passage characteristic (S21) of an optical modulator by optimizing the relation of inductances between a first bonding wire for connecting a modulator and a signal line of an electro-absorption modulator type optical modulator integrated laser diode and a second bonding wire for connecting the modulator and a terminal resistor.

As disclosed in JP-A-2001-257412 and JP-A-2001-308130, one of the ends of the terminal resistor is connected by the bonding wire to the modulator but the other end is connected to a ground electrode through a ground via-hole, or the like, without being connected to the modulator in the optical transmission module according to the related art. A cathode electrode or anode electrode of an electro-absorption type modulator is disposed on the chip back surface of the modulator integrated laser diode.

JP-A-2005-353910 (corresponding to US Patent Publication No. 2005/275053) describes, on the other hand, an electro-absorption modulator type optical modulator integrated laser diode having a different device structure. An optical modulator element and a laser diode element are arranged on a semi-insulating semiconductor board and an anode of each device is electrically isolated from its cathode so that driving by a single power source can be achieved.

SUMMARY OF THE INVENTION

The market of transceivers for 10 Gbit/s optical fiber transfer has been expanded from a conventional SONET/SDH system to an Ethernet (registered trade name) system. Whereas positive and negative two power sources can be supplied as the feed power source to the transceiver in the former, the change to a single power source feed system of only the positive power source has strongly been required for the latter.

When the electro-absorption type optical modulator integrated laser diode of the related art that is driven by the positive and negative two power sources is used for the transmission portion of the transceiver, the negative power source must be separately secured inside the transceiver to meet with the need for the single power feed system described above and a DC-DC converter, for example, must be afresh mounted into the transceiver. Therefore, the number of components to be mounted and the mounting area increase, and this circuit construction is extremely disadvantageous for reducing the size of the transceiver and its production cost.

As one of the means for solving such a problem, the application of the optical modulator integrated laser diode of JP-A-2005-353910 fabricated by integrating optical modulator elements and laser diode elements on a semi-insulating semiconductor board and capable of being driven by a single power source to an optical transmission module may be conceivable. When the circuit form in which one of the ends of the terminal resistor is connected to the ground electrode as described in JP-A-2001-256412 and JP-A2001-308130 is employed, the cathode or anode terminal of the optical modulator element disposed on the chip surface must be connected to the ground electrode by the bonding wire in order to use the optical modulator integrated laser diode chip disclosed in JP-A-2005-353910.

According to this circuit form, however, a very small inductance of the bonding wire added creates an unnecessary gain (peaking) in small signal passage characteristics of the optical modulator. As a result, it is difficult to acquire satisfactory output waveform quality even when an attempt is made to improve the characteristics by shortening the length of the bonding wire to the ground electrode within the range in which packaging is possible.

It is an object of the invention to provide a semiconductor element mounting board and an optical transmission module capable of solving the problems of the related art described above.

It is another object of the invention to provide an optical transmission module most suitable for an optical transfer transceiver for high speed use (e.g. 10 Gbit/s) by proposing a construction capable of simultaneously satisfying suppression of peaking in small signal passage characteristics (S21) and reduction of a small signal reflection coefficient (S11) in an optical transmission module of a single power source driving system.

The objects described above can be accomplished by, for example, an optical transmission module having a board to which an optical modulator integrated laser element having an optical modulator equipped with a cathode electrode on a surface of a board, a ground electrode, an input transfer line for inputting an electric signal to the optical modulator and a terminal resistor for the electric signal inputted are mounted, wherein an electrode on the ground side of the terminal resistor and the cathode or anode electrode of the optical modulator connected to the ground electrode are connected by a bonding wire.

A joint portion between the anode electrode of the optical modulator and the input transfer line by the bonding wire is preferably arranged on the opposite side to a joint portion between the cathode electrode of the optical modulator portion and the ground electrode by the bonding wire while interposing the optical modulator integrated laser element between them.

Further preferably, the optical modulator is arranged on the ground electrode or on the pattern electrode of the input transfer line.

According to the invention, it is possible to acquire the construction that can simultaneously suppress peaking in small signal passage characteristics (S21) for improving the output waveform of an optical modulator in an optical transmission module of a single power source driving system and can reduce a small signal reflection coefficient (S11), and can accomplish an optical transmission module most suitable for an optical transfer transceiver for high speed signals (for example, 10 Gbit/s).

Other objects, features and advantages of the invention will become apparent from the following description of the embodiments of the invention taken in conjunction with the accompanying drawings.

DESCRIPTION OF THE EMBODIMENTS

The invention will be hereinafter explained in detail with reference to the accompanying drawings. Though the invention will be explained hereby about signals having a transfer rate of 10 Gbit/s as high speed modulation signals, the invention is not limited to the signals of this speed as will be later explained.

Embodiment 1

The first embodiment of the invention will be explained with reference to FIGS. 1 through 3 and FIGS. 9 through 13.

Figure 1:
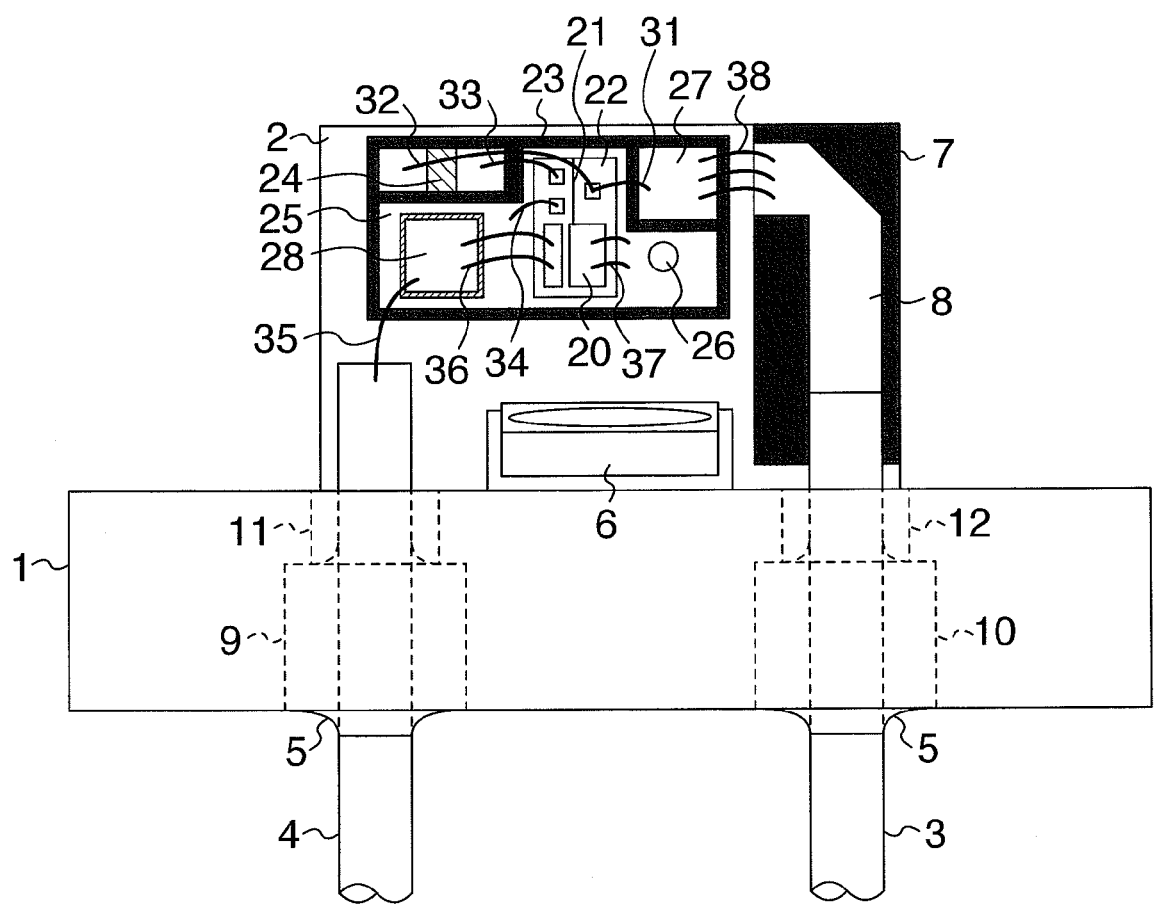
FIG. 1 is a structural view that shows main portions of an optical transmission module according to Embodiment 1 of the invention.
Figure 2:
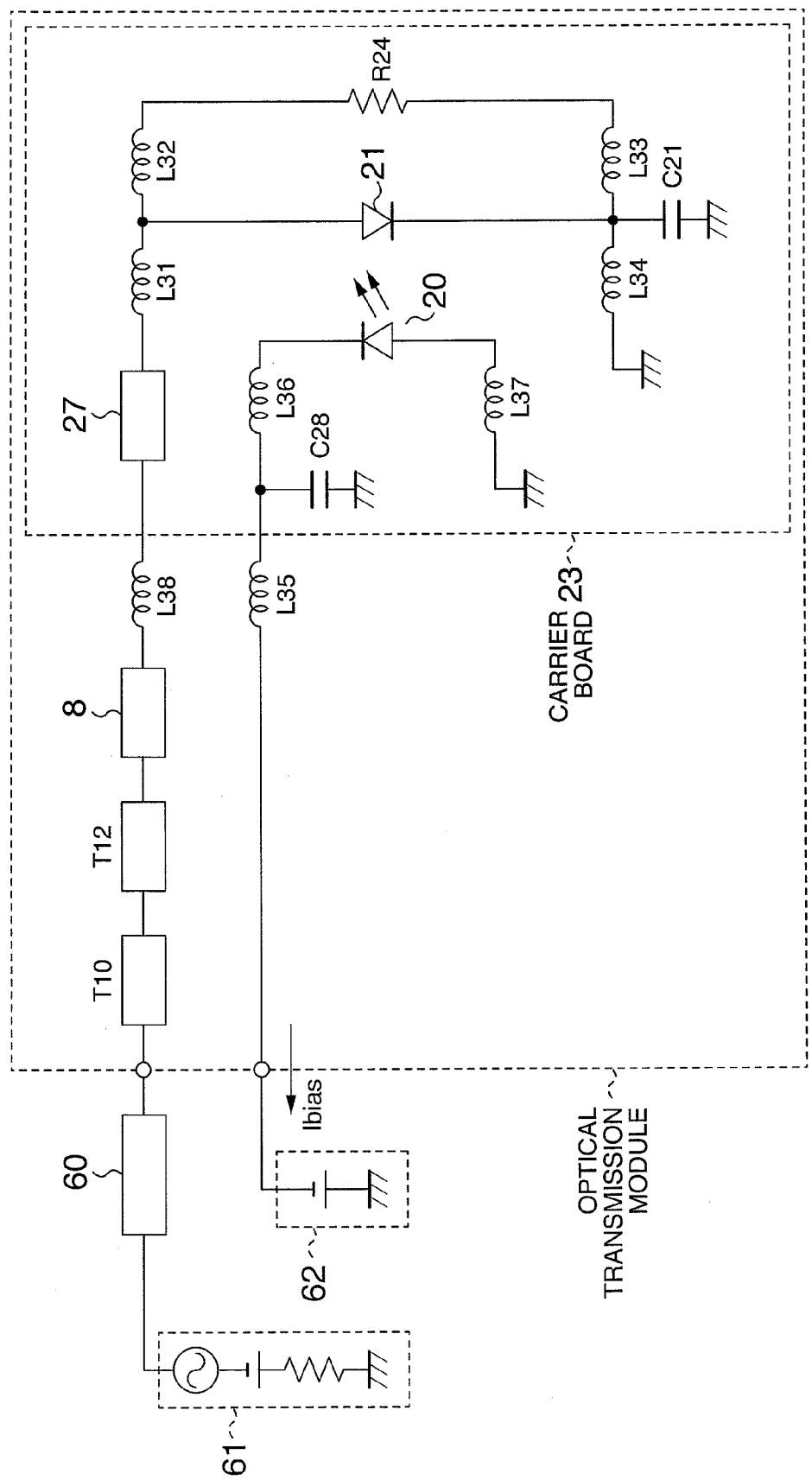
FIG. 2 is a main circuit diagram of the optical transmission module according to Embodiment 1 of the invention.
Figure 3:
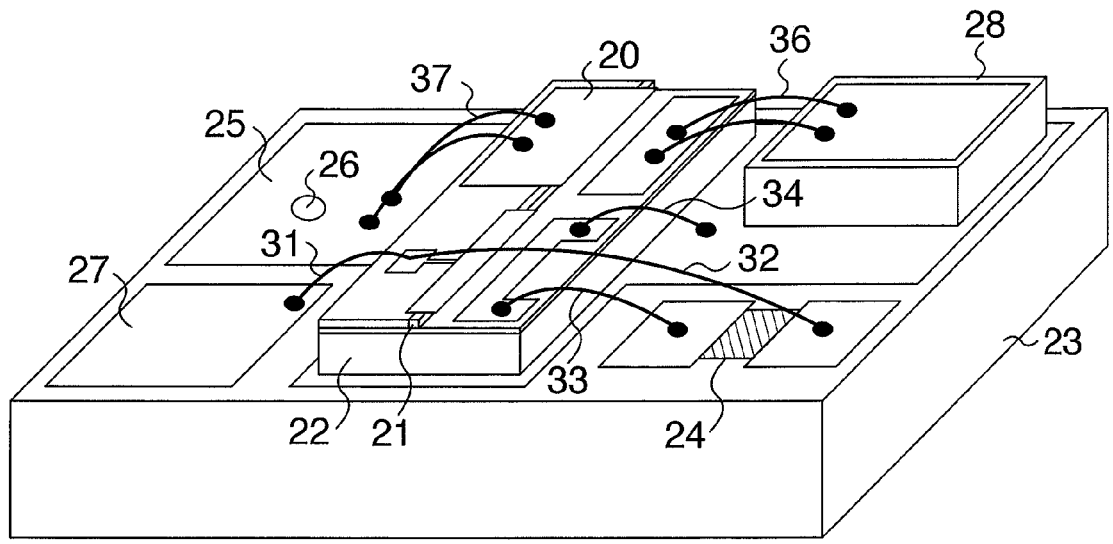
FIG. 3 is a detailed view of a carrier board portion according to Embodiment 1 of the invention.
Figure 9:
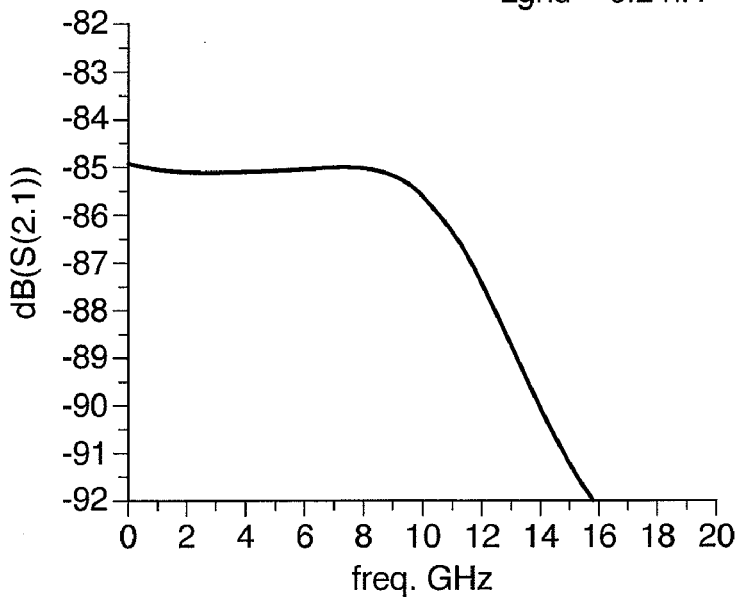
FIG. 9 is a graph showing the relation between a frequency and electric-optical small signal passage characteristic S21 of an optical transmission module, and is useful for explaining the effect of the invention.
Figure 10:
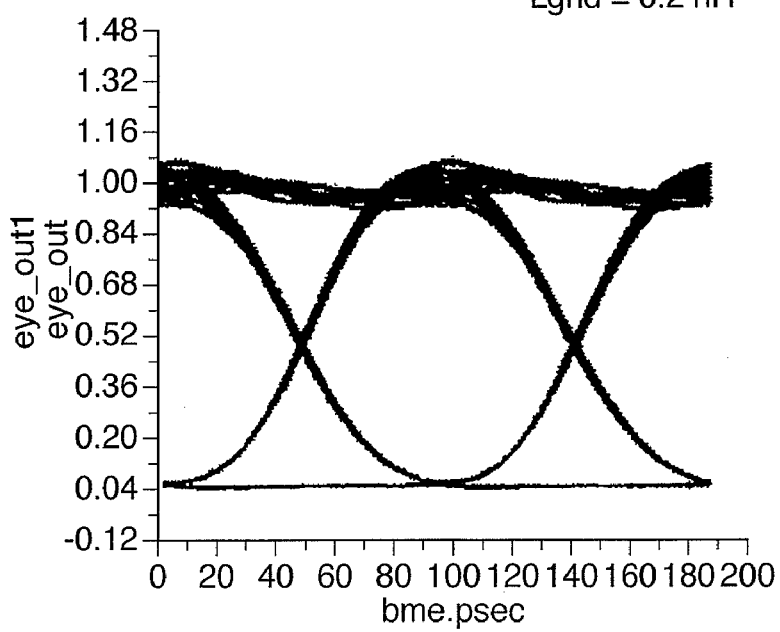
FIG. 10 is a graph that shows an optical output waveform of an optical transmission module and is useful for explaining the effect of the invention.
Figure 11:
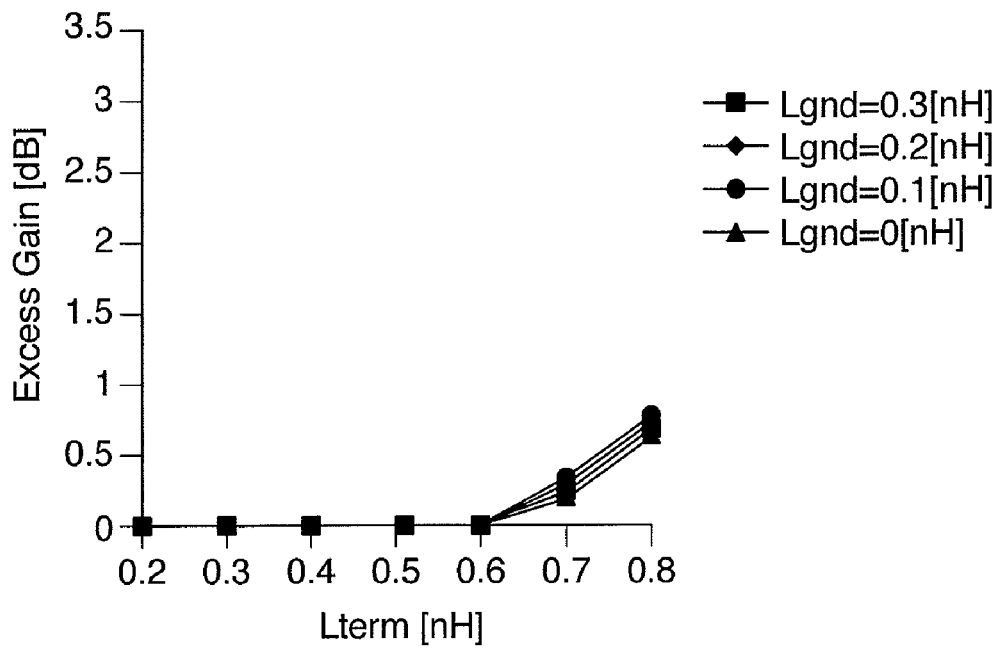
FIG. 11 is a graph that shows wire inductance dependence of excessive gain characteristics of an optical transmission module and is useful for explaining the effect of the invention.
Figure 12:
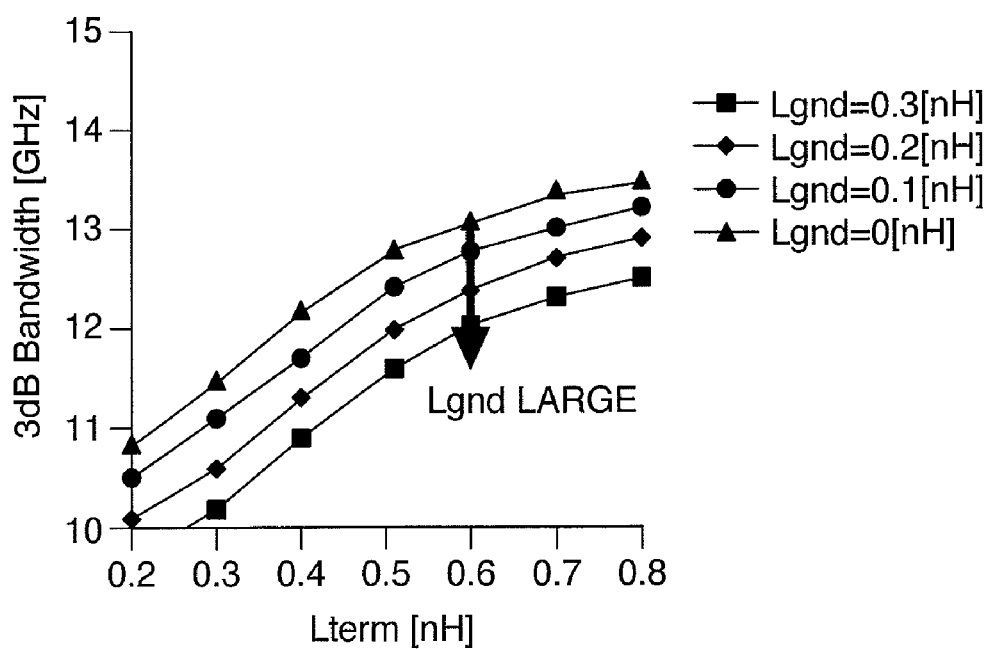
FIG. 12 is a graph that shows wire inductance dependence of 3 dB band characteristics of an optical transmission module and is useful for explaining the effect of the invention.
Figure 13:
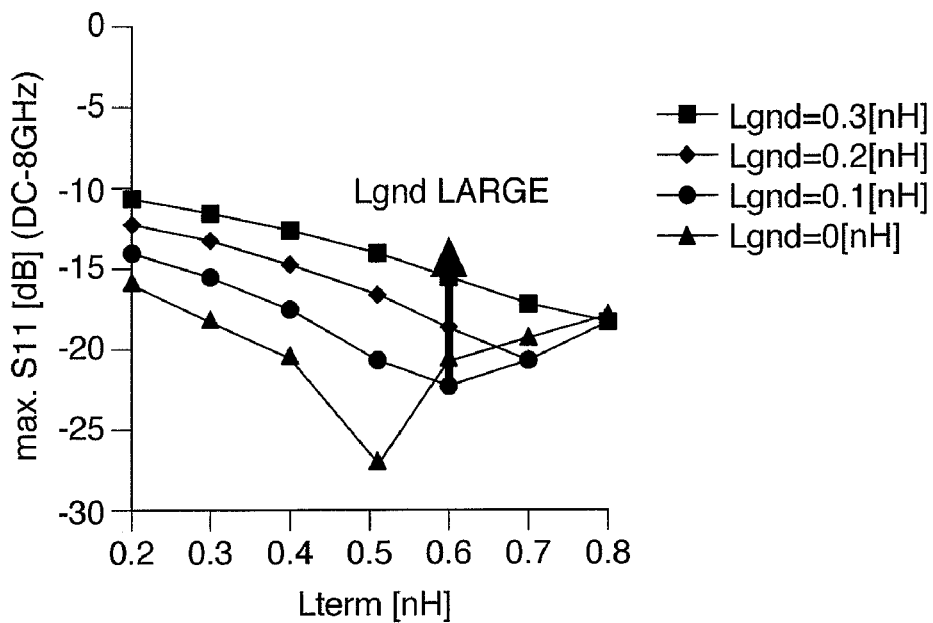
FIG. 13 is a graph that shows wire inductance dependence of input reflection characteristics of an optical transmission module and is useful for explaining the effect of the invention.

FIG. 1 is a structural view that shows main portions of an optical transmission module according to this embodiment, FIG. 2 is a main circuit diagram of the optical transmission module, and FIG. 3 is a detailed view of a carrier board portion for mounting optical semiconductor elements. FIG. 9 is a graph showing the relation between a frequency and electric-optical small signal passage characteristic S21 of the optical transmission module, FIG. 10 shows an optical output waveform of the optical transmission module, and FIGS. 11 through 13 are graphs respectively showing excessive gain characteristics, 3 dB band characteristics and input reflection characteristics S11 of the optical transmission module when inductance of a bonding wire to be connected to an optical modulator element is changed.

First, the construction of the optical transmission module will be explained with reference to FIG. 1. A package casing of a CAN type (a structure in which a terminal protrudes out from one of the sides of a cylinder) is used for a casing of the optical transmission module. Reference numeral 1 denotes a metal stem of the casing and reference numeral 2 denotes a metal seat for mounting main portions. Cylindrical lead pins 3 and 4 are so arranged on the metal stem 1 as to penetrate through a cylindrical through-hole (through-hole lower portion 10 and through-hole upper portion 12, and through-hole lower portion 9 and through-hole upper portion 11) and are fixed by sealing glass 5. A relay board 7 provided with a transfer line 8 as well as a carrier board 23 are mounted onto the metal seat 2.

A pattern of each of a resistor element 24 for terminating a high frequency signal, a ground electrode 25 and an input transfer line 27 is disposed on the surface of the carrier board 23 and the ground electrode 25 is connected to a back electrode of the carrier substrate 23 through a via-hole 26. A semiconductor chip 22 and a bypass capacitor 28 are mounted to the carrier board 23. The semiconductor chip 22 is an optical modulator integrated laser chip that forms a semiconductor laser diode element 20 and an optical modulator element 21 on a surface of a semi-insulating semiconductor wafer.

A continuous laser beam outputted from the semiconductor laser diode element 20 passes through the optical modulator element 21 and is then allowed to outgo to an optical fiber through a coupling lens (not shown in the drawing). The optical modulator element 21 modulates a laser beam continuously emitted to optical modulation signals by electrical modulation signals having a bit rate of about 10 Gbit/s from an external driving IC. A monitor photo diode 6 is disposed on the metal stem 1 and is fixed at a position at which it can receive back output light of the semiconductor laser diode element 20.

A first bonding wire 31 connects a pattern electrode of an input transfer line 27 to an anode electrode of the optical modulator element 21 and a second bonding wire 32 connects an anode electrode of the optical modulator element 21 to one of the ends of the resistance element 24. A third bonding wire 33 connects the other end of the resistor element 24 to a cathode electrode of the optical modulator element 21 and a fourth bonding wire 34 connects a cathode electrode of the optical modulator element 21 to the ground electrode 25. The input transfer line 27 on the carrier board 23 and the transfer line 8 on the relay board 7 are mutually connected to achieve low inductance through a plurality of bonding wires (or ribbon wires) 38. The transfer line 8 and the lead pin 3 are bonded by AuSn alloy, or the like. In this way is constituted an electric signal input line from the lead pin 3 to the optical modulator element 21.

The semiconductor laser diode element 20 connects the anode electrode to the ground electrode 25 through the bonding wire 37 and the cathode electrode, to the lead pin 4 through the bonding wires 35 and 36. A forward DC current is supplied to the laser diode element 20 as an external negative power source is connected to the lead pin 4. The output of the monitor photo diode 6 is outputted outside through another lead pin (not shown in the drawing).

A TO-56 type casing having a diameter of 5.6 mm, for example, is used as the CAN type package casing. Iron that is economical is suitable for reducing the cost when it is used as a material of the metal stem 1 and the metal seat 2. A dielectric material such as alumina or aluminum nitride is used for forming the relay board 7 and the carrier board 23. When aluminum nitride having a high heat transfer rate is used for the carrier board 23, the heat resistance from the semiconductor chip 22 to the metal seat 22 can be lowered and the temperature rise of the elements can be appropriately suppressed.

The carrier board may well be constituted by a bonded board of a dielectric board such as aluminum nitride and a metal sheet such as copper-tungsten and according to this construction, the heat resistance can be further lowered. The resistor element 24 is constituted by a tantalum nitride film and its resistance value is adjusted to 50 Ohms by laser trimming. The size can be suitably reduced when a parallel sheet type chip capacitor of a single-layered high dielectric board is used for the bypass capacitor 28.

Next, the circuit construction will be explained with reference to FIG. 2. The electric modulation signal outputted by the driving IC 61 is inputted to the input transfer line 27 of the carrier board 23 through an input system consisting of an external transfer line 60, a coaxial line T10 constituted by the through-hole lower portion 10, the lead pin 3 and the sealing glass 5, a coaxial line T12 constituted by the through-hole upper portion 12, the lead pin 3 and air, a transfer line 8 of the relay board 7 and inductance L38 of the bonding wire 38. The output impedance of the driving IC 61 is set to 50 Ohms.

The external transfer line 60 is constituted by the transfer line on the printed board for mounting the driving IC 61 and the transfer line on the flexible board for connecting the printed board and the lead pin 3 and its characteristic impedance is set to 50 Ohms. The characteristic impedance of the coaxial line T10 is set to 30 Ohms and the characteristic impedance of each of the coaxial line T12, the transfer line 8 and the input transfer line 27 is set to 50 Ohms. Symbol R24 represents the resistance of the resistor element 24. Symbols L31, L32, L33 and L34 respectively represent inductances of the first, second, third and fourth bonding wires 31, 32, 33 and 34. The electric modulation signal is inputted across the anode electrode and the cathode electrode of the optical modulator element 21 through these circuit elements. Symbol C21 represents a parasitic capacitance that occurs between the cathode electrode of the optical modulator element 21 and the back electrode.

On the other hand, the forward DC current Ibias is supplied to the semiconductor laser diode element 20 from the external current driving circuit 62 to let it output a laser beam. Here, symbol L35, L36 and L37 respectively represent the inductances of the bonding wires 35, 36 and 37 and symbol C28 does the capacitance of the bypass capacitor 28. Because the optical modulator element 21 is generally operated by applying a backward bias voltage, this embodiment 1 uses a single negative power source such as −5.2 V for the driving IC 61 and the current driving circuit 62.

Next, the construction of the carrier board portion will be explained with reference to FIGS. 2 and 23.

Figure 23:
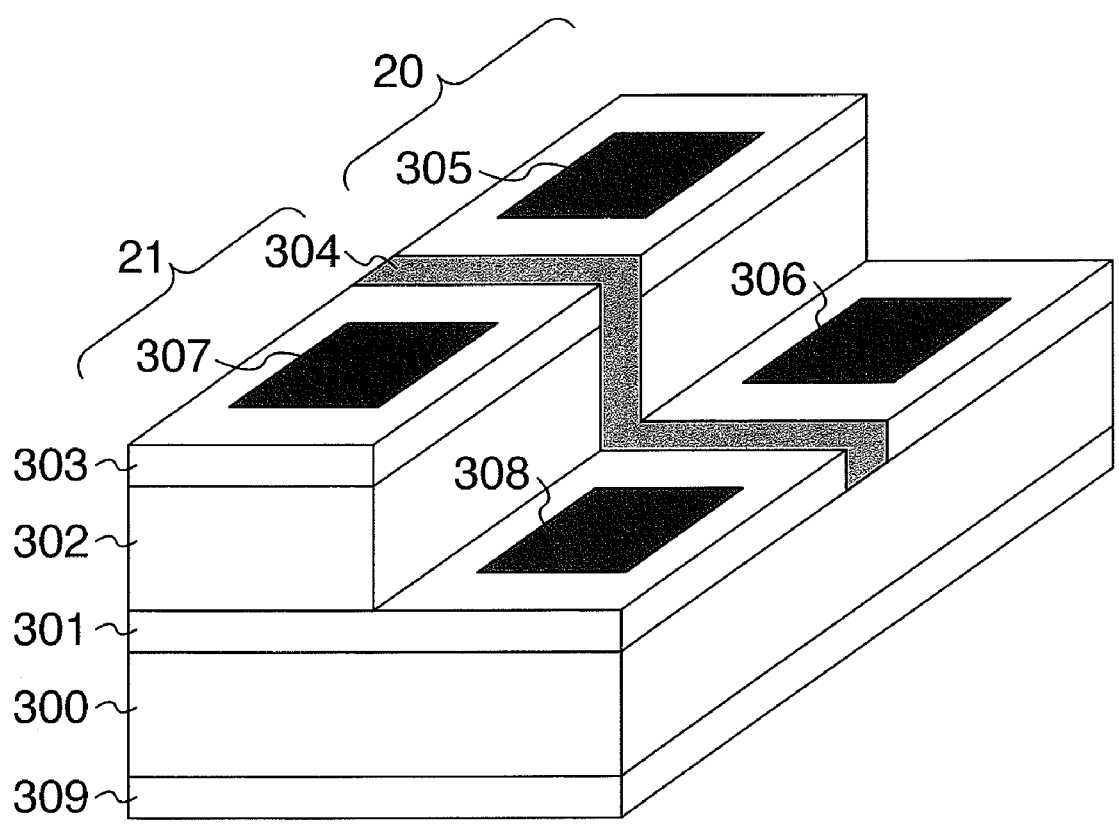
FIG. 23 is a schematic view that shows a structure of an optical modulator integrated laser chip according to Embodiment 1 of the invention.

FIG. 23 is a schematic view of an element structure of a semiconductor chip 22. An integrated device of semiconductor laser diode elements 20 as distributed feedback laser diodes (DFB-LD) 20 and optical modulator elements 21 as electro-absorption modulators (EAM) on a surface of a Fe-doped semi-insulating InP substrate 300 is used s the semiconductor chip 22.

The element formation portion at the upper part of the semi-insulating InP substrate 300 includes an electrically conductive n type layer 301, a semiconductor layer 302 necessary for each device and a p type contact layer 303 at the uppermost part that are formed by crystal growth. A region between the elements is converted to a high resistance by means such as ion implantation (high resistance layer 304) and each element is electrically isolated. The anode electrode 305 and cathode electrode 307 of the semiconductor laser diode element 20 and the anode electrode 307 and cathode electrode 308 of the optical modulator element 21 are disposed on the surface of the semiconductor chip 22. The back electrode 309 for bonding to the carrier board 23 is disposed on the back of the chip and is electrically isolated from other electrodes disposed on the surface side.

Referring to FIG. 3, the length of the first and fourth bonding wires 31 and 34 is reduced within the possible range from the aspect of the limitation of packaging, so that the inductances L31 and L34 of these wires can be reduced. The connection portion of the first bonding wire 31 to the input transfer line 27 is positioned on the opposite side to the connection portion of the fourth bonding wire 34 to the ground electrode 25 while interposing the semiconductor chip 22 between them.

For, when the first bonding wire 31 and the fourth bonding wire 34 are arranged in parallel and adjacent to each other, their inductances L31 and L34 increase owing to the occurrence of the mutual inductance because the modulation signal currents flowing through them have mutually opposite directions, thereby inviting degradation of the characteristics of the optical transmission module. Since the embodiment 1 employs the arrangement described above, it can suppress the occurrence of the mutual inductance and can reduce the inductances L31 and L34.

On the other hand, it is preferred that the second bonding wire 32 and the third bonding wire 33 have a certain level of length so that the sum of their inductances L32 and L33 is approximate to a desired value. According to the studies of the inventors of the present invention, the value (the sum of L32 and L33) is preferably from about 0.6 nH to about 0.8 nH though the value varies depending on the packaging form and on the electrical characteristics of the optical modulator element.

When the second bonding wire 32 and the third bonding wire 33 are arranged in parallel and adjacent to each other, the directions of the modulation signal currents flowing through them are mutually opposite. Therefore, their wire inductances L32 and L33 can be increased through the occurrence of the mutual inductance. Owing to this effect, the desired inductance value can be obtained even when the length of the second and third bonding wires is reduced and the size of the carrier board 23 and the size of the optical transmission module can be reduced.

When the first bonding wire 31 and the second bonding wire 32 is linearly formed by one wire with the anode electrode of the optical modulator element 2 being the relay point as shown in FIG. 3, the area of the anode electrode of the optical modulator element 21 can be minimized and the element capacitance of the optical modulator element 21 can be appropriately reduced.

Incidentally, the cathode electrode 308 of the optical modulator element 21 is connected to the conductive n type layer 301 that is positioned at the lowermost position of the element conductor layer as shown in FIG. 23. Therefore, the capacitance C21 between the cathode electrode and the back electrode is greater than the capacitance between the anode electrode 307 and the back electrode 309 even when the parasitic capacitance created with the back electrode 309 is suppressed to a minimum level.

In the embodiment 1, the back electrode 309 is bonded onto the ground electrode 25 and the cathode electrode 308 is connected to the ground electrode 25 through the fourth bonding wire 34. In consequence, degradation of performance of the circuit operation owing to the capacitance C2 between the cathode electrode 308 and the back electrode can be minimized and excellent optical transmission module characteristics can be appropriately acquired. Incidentally, the pattern of the ground electrode is hereby formed in such a fashion that the back electrode of the modulator portion is positioned on the ground electrode of the carrier board but the electrode of the input transfer line may be formed in such a fashion that the pattern electrode of the input transfer line is positioned below the back electrode of the modulator portion.

Next, the characteristics of the optical transmission module according to this embodiment will be explained with reference to FIGS. 9 and 10. These drawings show the characteristics calculated by using a circuit simulator. It is assumed in this embodiment that the inductance L31 by the first bonding wire is 0.2 nH and the sum Lterm (=L32+L33) of inductances of the second and third bonding wires 32 and 33 is 0.6 nH, for example. When the inductance from the cathode electrode to the ground electrode of the optical modulator element 21 resulting from the fourth bonding wire 34 is expressed as Lgnd (=L34), small signal passage characteristics (S21) shown in FIG. 9 and optical output waveform characteristics shown in FIG. 10 at Lgnd=0.2 nH can be acquired.

As shown in FIG. 9, the S21 characteristics do not have unnecessary peaking within the band and the 3 dB band characteristics are as high as 12 GHz and exhibit excellent characteristics. Owing to the characteristics, excellent waveform quality as represented by the optical output waveform shown in FIG. 10 can be acquired.

Figure 14:
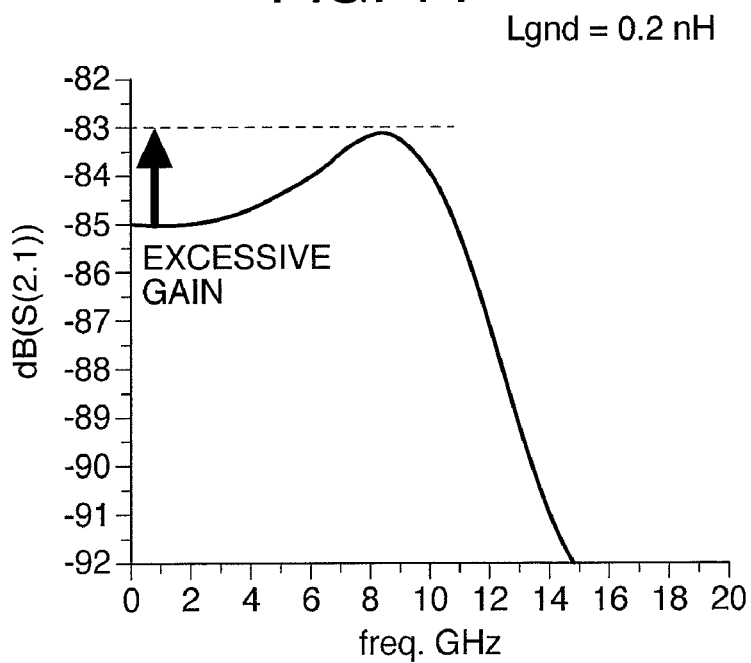
FIG. 14 is a graph that shows characteristics when a circuit form according to the related art is used.
Figure 15:
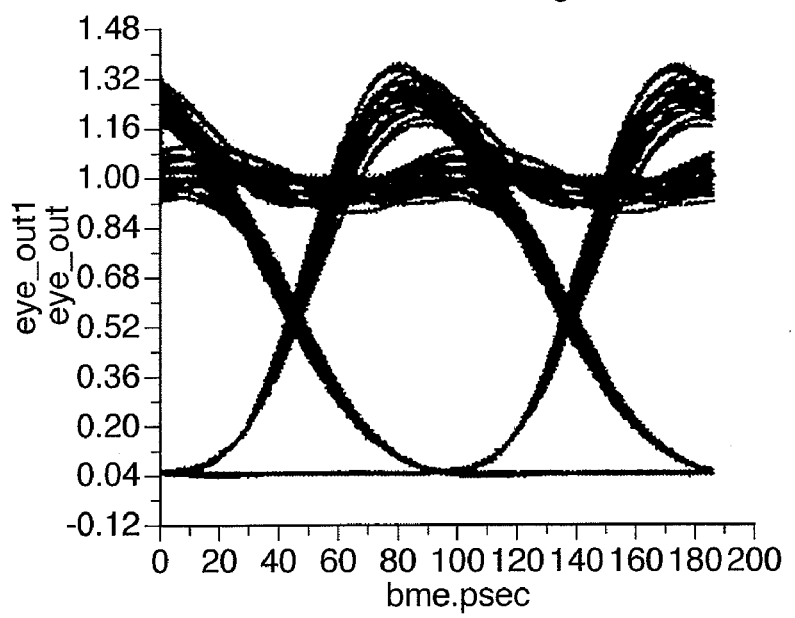
FIG. 15 is a graph that shows characteristics when a circuit form according to the related art is used.

For comparison, FIGS. 14 and 15 show the small signal passage characteristics (S21) and the calculation result of the optical output waveform of the related art circuit system in which one of the ends of the terminal resistor is connected to the ground electrode. Unnecessary peaking (excessive gain) of about 2 dB occurs within the band owing to the inductance Lgnd (=0.2 nH) in the S21 characteristics as shown in FIG. 14 and critical degradation of waveform quality with over-shoot occurs in the optical output waveform as shown in FIG. 15.

Next, the effect of the invention will be explained with reference to FIGS. 11, 12 and 13.

FIG. 11 shows dependence of the excessive gain due to peaking in the small signal passage characteristics on the bonding wire inductances Lterm and Lgnd. It can be appreciated from the drawings that the influences on the excessive gain hardly exist even when Lgnd is changed from 0 to 0.3 nH in the circuit construction of the invention, and can be controlled substantially primarily by only the value of Lterm. For example, Lterm may well be controlled to 0.6 nH or below so as to completely suppress the excessive gain.

FIG. 12 shows dependence of the 3 dB band in the small signal passage characteristics (S21) on the bonding wire inductances Lterm and Lgnd. The drawing shows that the decrease of Lgnd and the increase of Lterm are effective for improving the 3 dB band. In other words, it is preferred to set Lterm to 0.6 nH and to reduce Lgnd within the range in which packaging is possible, in order to optimize the 3 dB band while the excessive gain is suppressed.

When Lterm is set to 0.6 nH and Lgn, to 0.3 nH, too, 12 GHz can be acquired as the 3 dB band and sufficient band characteristics can be secured for the operation at 10 Gbit/s.

FIG. 13 shows dependence of the maximum value of the input reflection characteristics S11 in the frequency range 0-8 GHz on the bonding wire inductances Lterm and Lgnd. The drawing shows that a combination that renders the reflection characteristics minimal exists, and that it is appropriate to select Lterm from the range of 0.6 nH to 0.8 nH when Lgnd is 0.1 nH to 0.3 nH. When Lterm is 0.6 nH, for example, S11 can be se to −20 dB or below by setting Lgnd to 0.1 nH but S11 of −15 dB or below can be obtained even when Lgnd is increased to 0.3 nH. Satisfactory input reflection characteristics can be thus secured for the operation at 10 Gbit/s.

Figure 16:
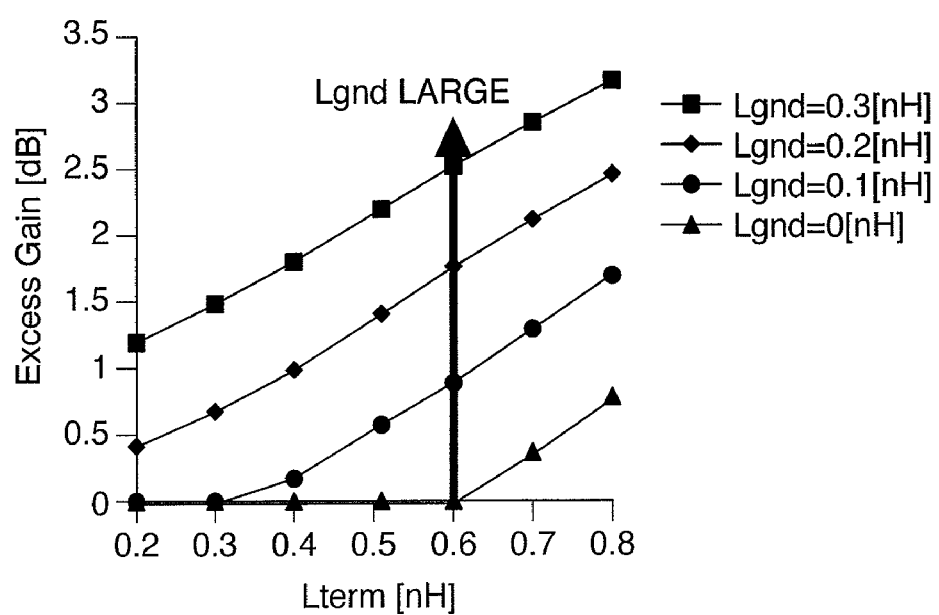
FIG. 16 is a graph that shows wire inductance dependence of excessive gain characteristics of an optical transmission module when a circuit form according to the related art is used.
Figure 17:
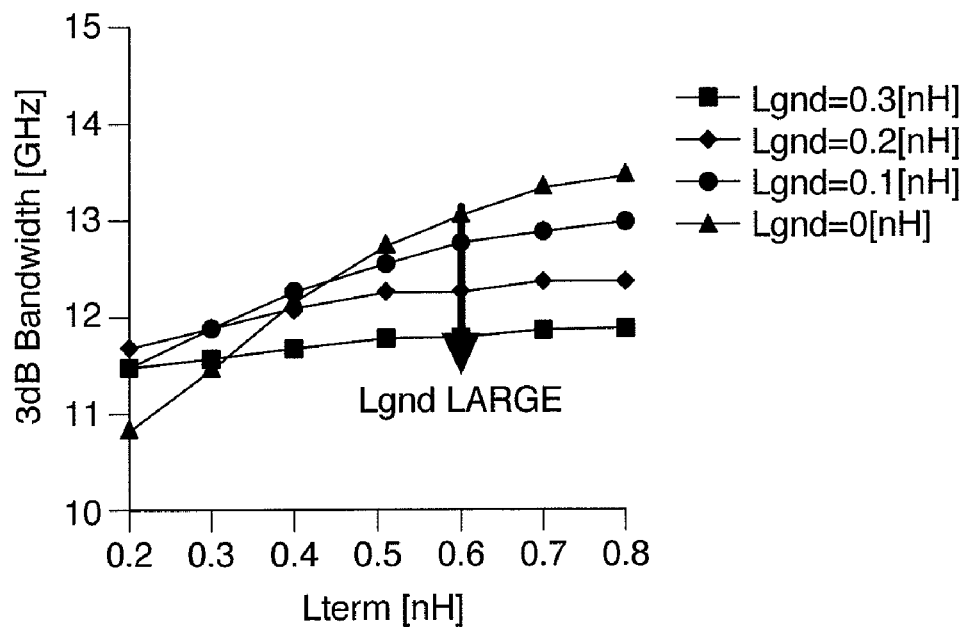
FIG. 17 is a graph that shows wire inductance dependence of 3 dB band characteristics of an optical transmission module when a circuit form according to the related art is used.
Figure 18:
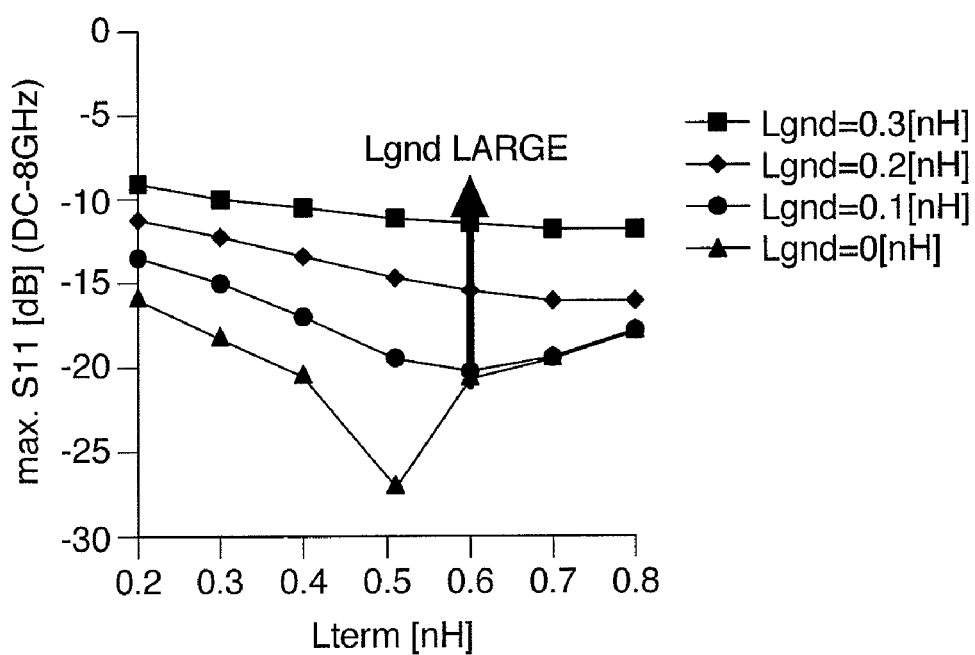
FIG. 18 is a graph that shows wire inductance dependence of input reflection characteristics of an optical transmission module when a circuit form according to the related art is used.

For comparison, FIGS. 16 to 18 show the excessive gain, the 3 dB band and the input reflection characteristics S11 when the related art circuit system in which one of the ends of the terminal resistor is connected to the ground electrode without disposing the third bonding wire.

First, FIG. 16 shows dependence of the excessive gain due to peaking in the small signal passage characteristics (S21) on the bonding wire inductances Lterm and Lgnd. It can be appreciated from the drawings that the excessive gain drastically increases when Lgnd is changed from 0 to 0.3 nH. The excessive gain can be decreased to a certain extent by decreasing the value Lterm and an excessive gain of 0.4 dB occurs even when Lterm is decreased to 0.2 nH at Lgnd=0.2 nH, for example.

FIG. 17 shows dependence of the 3 dB band in the small signal passage characteristics (S21) on the bonding wire inductances Lterm and Lgnd. The drawing shows that the decrease of Lgnd and the increase of Lterm are effective for improving the 3 dB band.

On the other hand, FIG. 18 shows dependence of the maximum value of the input reflection characteristics S11 in the frequency range 0-8 GHz on the bonding wire inductances Lterm and Lgnd. The drawing shows that S11 drastically increases (gets deteriorated) when Lgnd is changed from 0 to 0.3 nH. When Lterm is decreased, S11 further increases. When Lgnd is 0.2 nH, for example, S11 increases to −11 dB if Lterm is decreased to 0.2 nH to suppress the excessive gain to a low level.

According to the studies of the present inventors, degradation of the characteristics is vigorous in the related art circuit system when Lgnd increases, ad optimum design by other factors such as inductances is difficult.

As explained above, the circuit system according to the invention can accomplish a suitable optical transmission module when applied to an optical transceiver having a bit rate of about 10 Gbit/s. Here, the term "bit rate of about 10 Gbit/s" includes the SONET specification having bit rates of 9.95 Gbit/s, 10.7 Gbit/s and 11.1 Gbit/s and the Ether specification having bit rates of 10.3 Gbit/s and 11.3 Gbit/s and is not limited to these values.

In this embodiment, the characteristic impedance of the coaxial line constituted by the through-hole 10, the lead pin 3 and the sealing glass 5 is set to 30 Ohms but the characteristic impedance of the coaxial line may be changed within the range of 20 to 50 Ohms by selecting the shape of the member and the glass material suitable for sealing. Though the resistance value of the resistor element 24 is set to 50 Ohms, it may be changed within the range of 40 to 60 Ohms, for example, through matching with driving IC mounted to an actual transceiver.

As a modified example, all the ground potentials may be set to a constant voltage potential such as +5.0 V in the circuit construction of the embodiment shown in FIG. 2. In such a case, the driving IC 61 and the current driving circuit 62 can be driven at +5.0 V and an optical transmission module operating by use of only a single positive power source can be achieved. The backward bias voltage of the optical modulator element 21 may be applied by another DC voltage source by inserting a bias tee between the driving IC 61 and the optical transmission module. In such a case, the operation at a lower voltage power source becomes possible because the driving IC 61 needs to drive only the voltage amplitude component of the electric modulation signal and this circuit construction is suitable for lowering the power consumption of the transceiver.

This embodiment uses the CAN type metal package casing for the casing of the optical transmission module but is not limited thereto. Therefore, as still another modified example, the invention may use a box-shaped packaging casing using ceramic and metal. To precisely control the temperatures of the semiconductor laser diode element and the optical modulator element, a Peltier element may be disposed below the carrier board. These modified embodiments are also common in the later-appearing second and third embodiments.

The crystal structure of the element formation portion of the semiconductor chip 22 in this embodiment includes the conductive n type layer, the semiconductor layer necessary for each device and the p type contact layer at the uppermost portion in order named on the semi-insulating semiconductor board, but this order may be reversed to the conductive p type layer, the semiconductor layer necessary for each device and the n type contact layer at the uppermost portion. The polarity of each of the semiconductor chip 22, the optical modulator element 21, the driving IC 61 and the current driving circuit 62 shown in FIG. 2 becomes opposite with the reversion of the conductivity type. In such a case, the driving IC 61 and the current driving circuit 62 can be driven at +5.0 V, and an optical transmission module that operates by using only a single positive power source can be accomplished.

Embodiment 2

The second embodiment of the invention will be explained with reference to FIGS. 4 to 6 and FIGS. 19 to 22.

Figure 4:
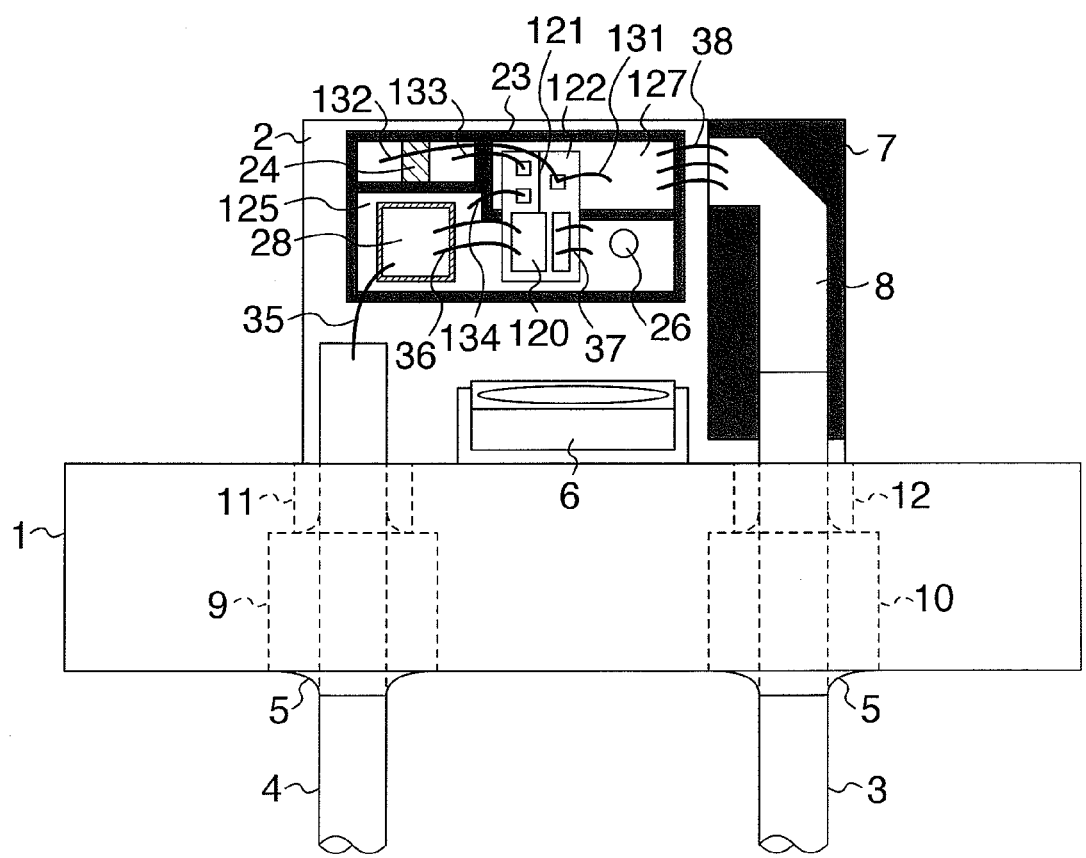
FIG. 4 is a structural view that shows main portions of an optical transmission module according to Embodiment 2 of the invention.
Figure 5:
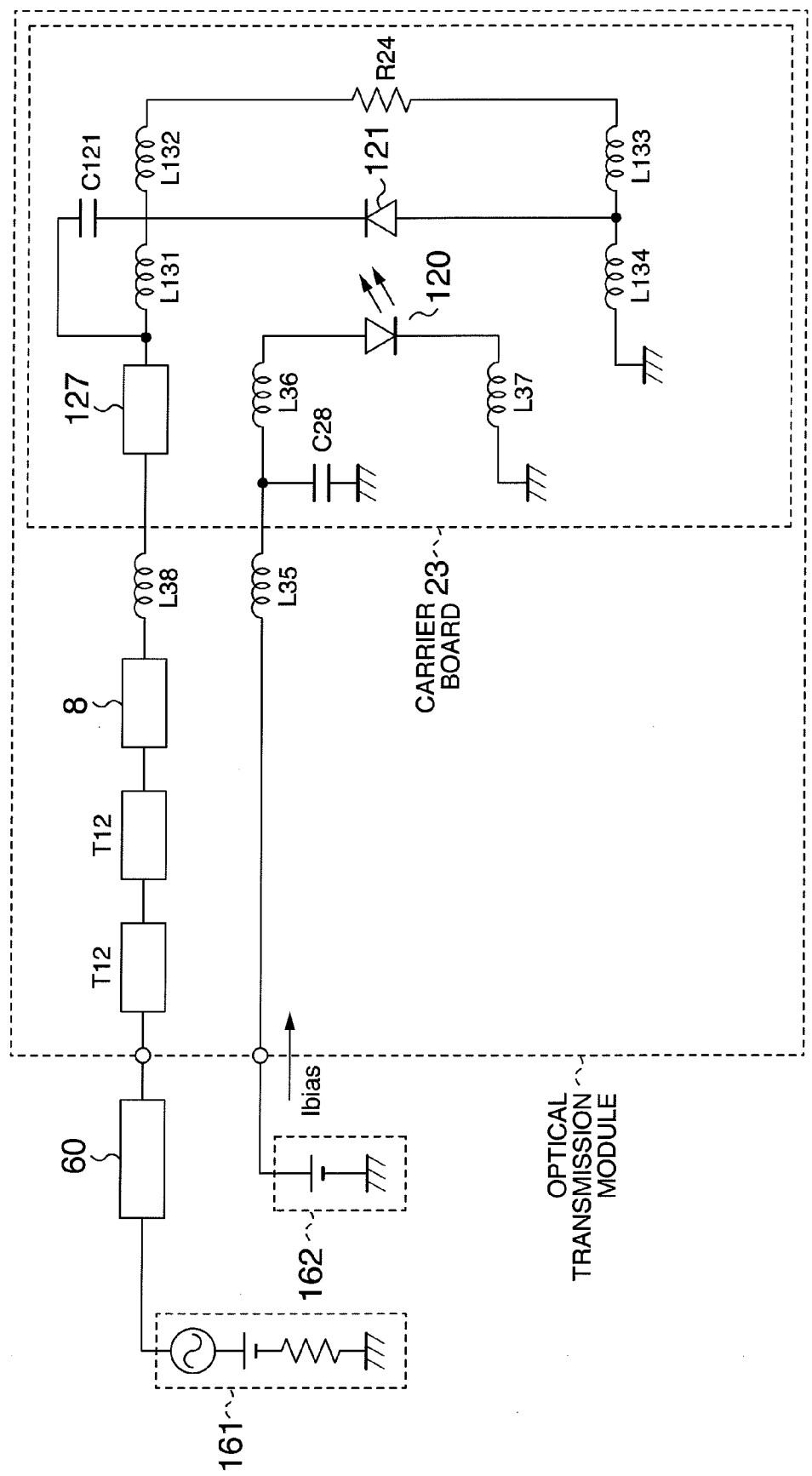
FIG. 5 is a main circuit diagram of the optical transmission module according to Embodiment 2 of the invention.
Figure 6:
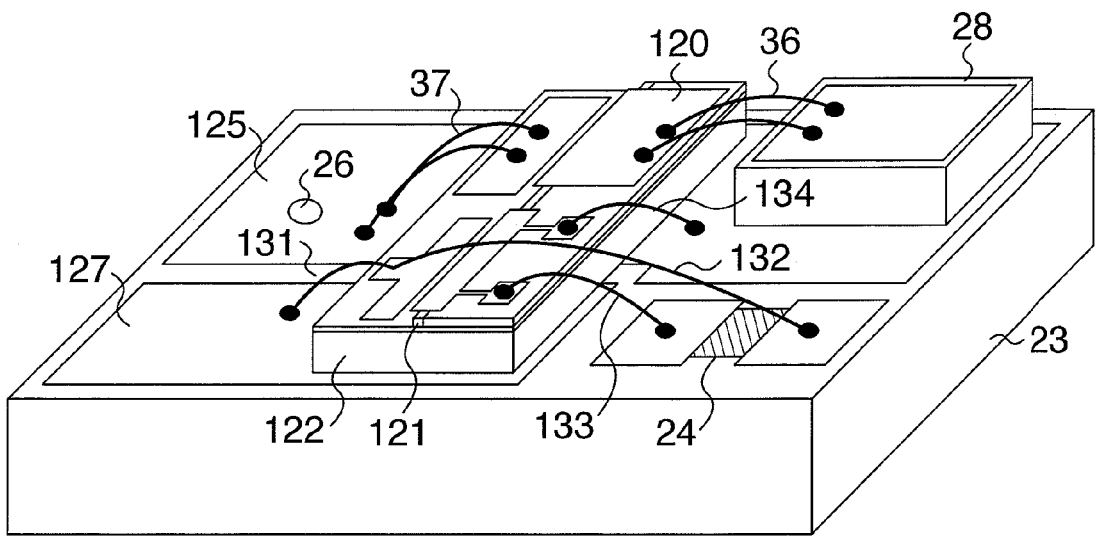
FIG. 6 is a detailed view of a carrier board portion according to Embodiment 2 of the invention.
Figure 19:
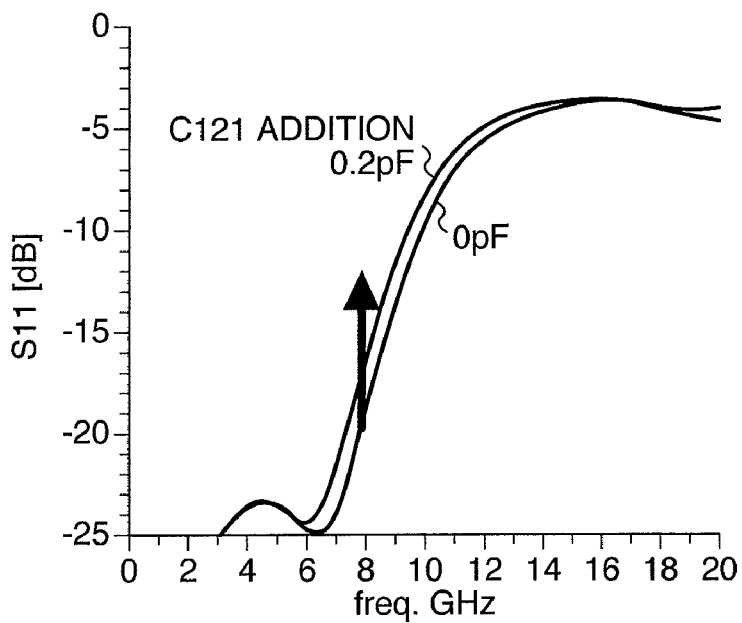
FIG. 19 is a graph that shows input reflection characteristics S11 of an optical transmission module and is useful for explaining the effects of the invention.
Figure 20:
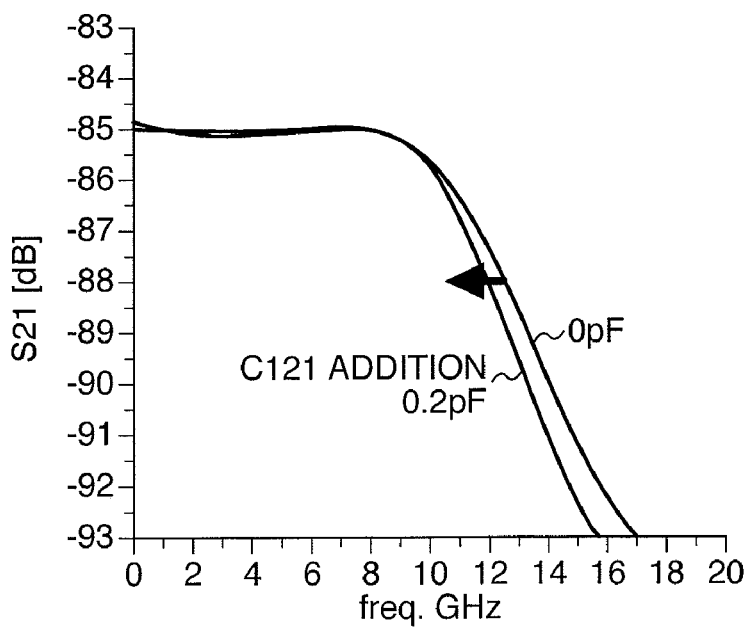
FIG. 20 is a graph that shows small signal passage characteristics S21 of an optical transmission module and is useful for explaining the effects of Embodiment 2 of the invention.

FIG. 4 is a structural view that shows main portions of an optical transmission module according to this embodiment. FIG. 5 is a main circuit diagram of the optical transmission module. FIG. 6 is a detailed view of a carrier board portion. FIG. 19 is a graph that shows input reflection characteristics S11 of this embodiment. FIG. 20 is a graph that shows small signal passage characteristics S21.

As shown in FIGS. 4 and 6, the main differences from the embodiment 1 reside in that the arrangement of the anode and cathode of the surface electrodes of the semiconductor chip 122 is reversed to the right and left and that the input transfer line 127 is extended to a portion below the optical modulator element 21. Independent back electrodes are disposed below the optical modulator element 121 and the semiconductor laser diode element 120 on the back of the semiconductor chip 122. In this embodiment, the ground electrode 125 is arranged below only the semiconductor laser diode element and is not arranged below the optical modulator element 121.

The first bonding wire 131 connects the pattern electrode of the input transfer line 127 to the cathode electrode of the optical modulator element 121 and the second bonding wire 132 connects the cathode electrode of the optical modulator element 121 to one of the ends of the resistor element 24. The third bonding wire 133 connects the other end of the resistor element 24 to the anode electrode of the optical modulator element 121 and the fourth bonding wire 134 connects the anode electrode of the optical modulator 121 to the ground electrode 125.

Referring to FIG. 5, symbols L131, L132, L133 and L134 respectively represent inductances of the first, second, third and fourth bonding wires 131, 132, 133 and 134. Symbol C121 represents a parasitic capacitance that occurs between the cathode electrode of the optical modulator element 121 and the back electrode. A single positive power source of +5.0 V, or the like, is used for the driving IC 161 and the current driving circuit 162.

The cathode electrode of the optical modulator element 121 is connected to the conductive n type layer that is positioned in the lowermost layer among the element conductor layers. Therefore, when the parasitic capacitance occurring between the cathode electrode and the back electrode is suppressed to the minimum level, too, the capacitance C121 between the cathode electrode and the back electrode is greater than the capacitance between the anode electrode and the back electrode. In this embodiment 2, the back electrode of the optical modulator element 121 is connected to the input transfer line 127 and the cathode electrode is connected to the input transfer line 127 through the first bonding wire 131. In this way, the degradation of performances of the circuit operation resulting from the capacitance C121 between the cathode electrode and the back electrode can be suppressed to minimum and excellent optical transmission module characteristics can be suitably acquired. Incidentally, the electrode pattern is formed hereby in such a fashion that the back electrode of the modulator portion is positioned on the pattern electrode of the input transfer line, but the electrode pattern may be formed in such a fashion that the ground electrode is positioned below the back electrode of the modulator portion as in the first embodiment shown in FIG. 3.

The effect of this embodiment will be further explained with reference to FIGS. 14 and 15.

FIGS. 14 and 15 show the reflection characteristics S11 and the small signal passage characteristics S21 calculated by using circuit simulation. While the capacitance C121 between the cathode electrode and the back electrode is assumed to be 0.2 pF, for example, its influences on S11 and S21 are analyzed by simulation.

Figure 21:
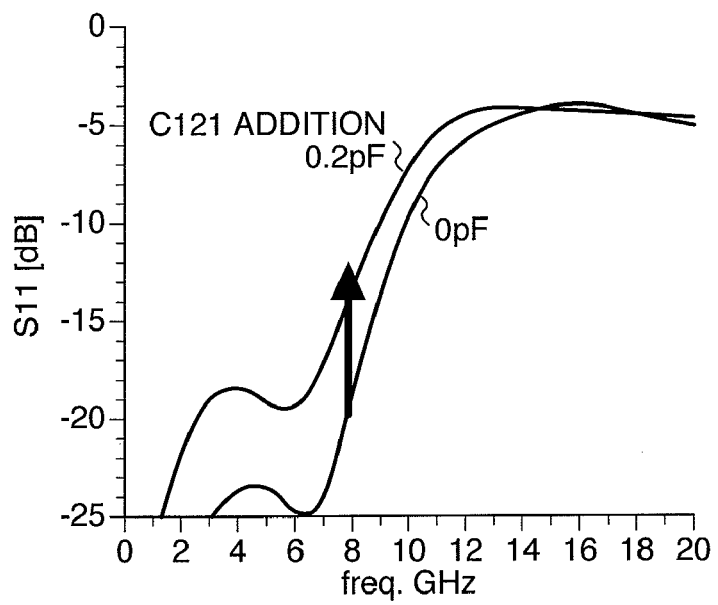
FIG. 21 is a graph that shows input reflection characteristics S11 of an optical transmission module when the structure of Embodiment 2 is not applied.
Figure 22:
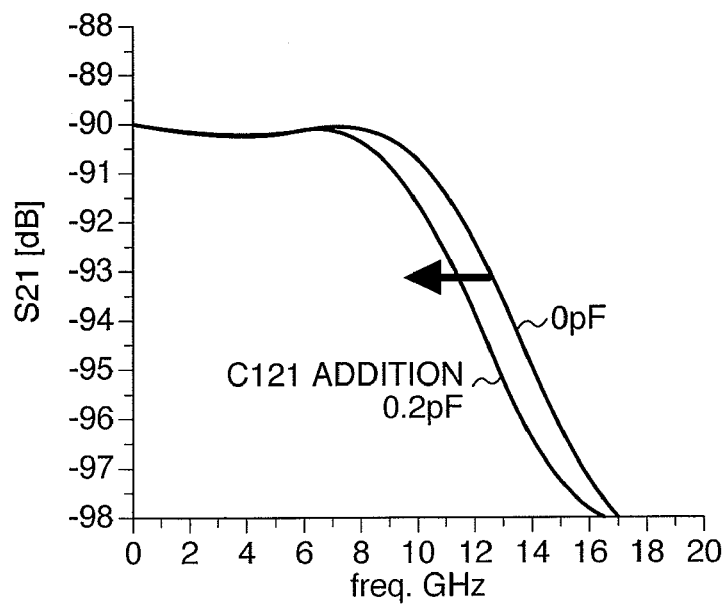
FIG. 22 is a graph that shows small signal passage characteristics S21 of an optical transmission module when the structure of Embodiment 2 is not applied.

In this embodiment, the capacitance C121 is positioned between the input transfer line 127 and the cathode electrode. In this case, the rise of S11 occurs as shown in FIG. 14 and the drop of the 3 dB band occurs as shown in FIG. 15. However, the degree of each of the rise and the drop is relatively small. For comparison, FIGS. 21 and 22 show the influences of the capacitance C121 (assumed to be 0.2 pF) on the reflection characteristics S11 and the small signal passage characteristics S21 when the ground electrode 125 is arranged below the optical modulator element 121. The capacitance C121 is positioned between the ground electrode 125 and the cathode electrode according to this arrangement. In this case, S11 drastically increases to about 5 dB as shown in FIG. 21 and the 3 dB band decreases by about 1.2 GHz as shown in FIG. 22. It can be understood from these results that the degradation quantities exerted by the capacitance C121 on the reflection characteristics S11 and on the small signal passage characteristics S21 can be suppressed to the minimum level by employing the construction of the embodiment 2.

Embodiment 3

The third embodiment of the invention will be explained with reference to FIGS. 7 and 8.

Figure 7:
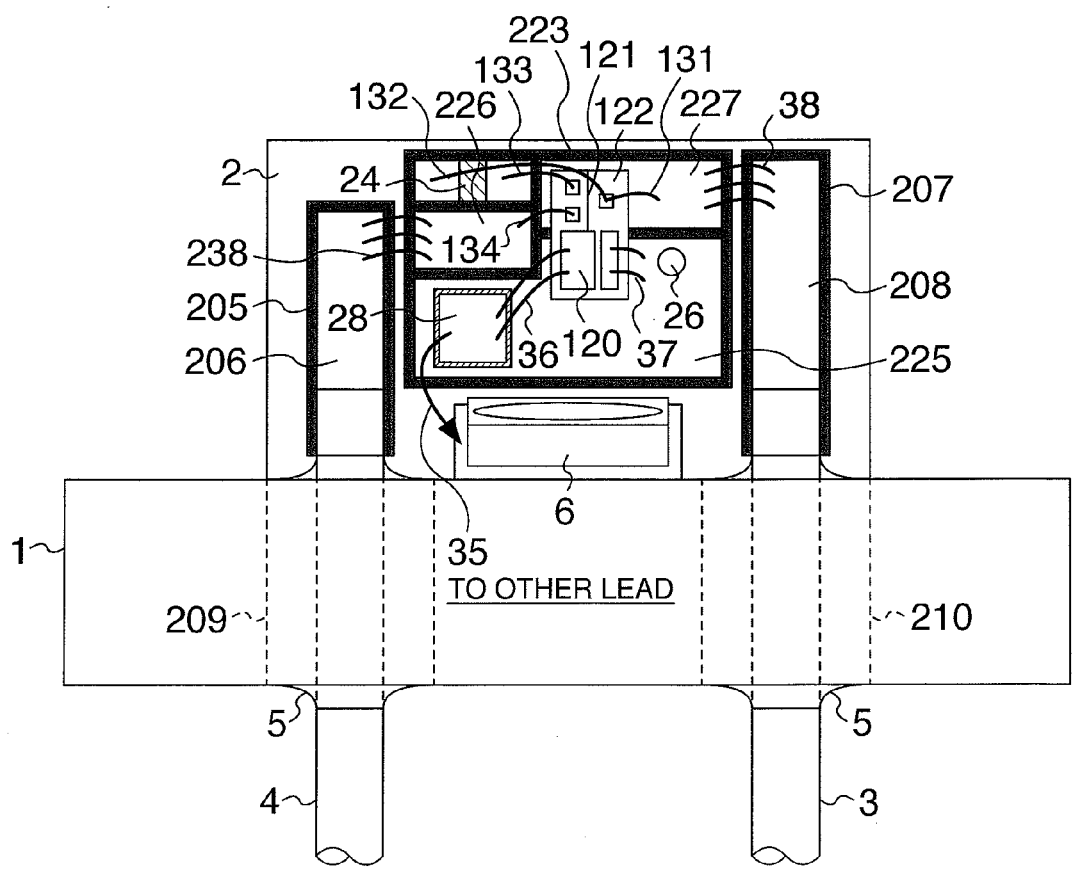
FIG. 7 is a structural view that shows main portions of an optical transmission module according to Embodiment 3 of the invention.
Figure 8:
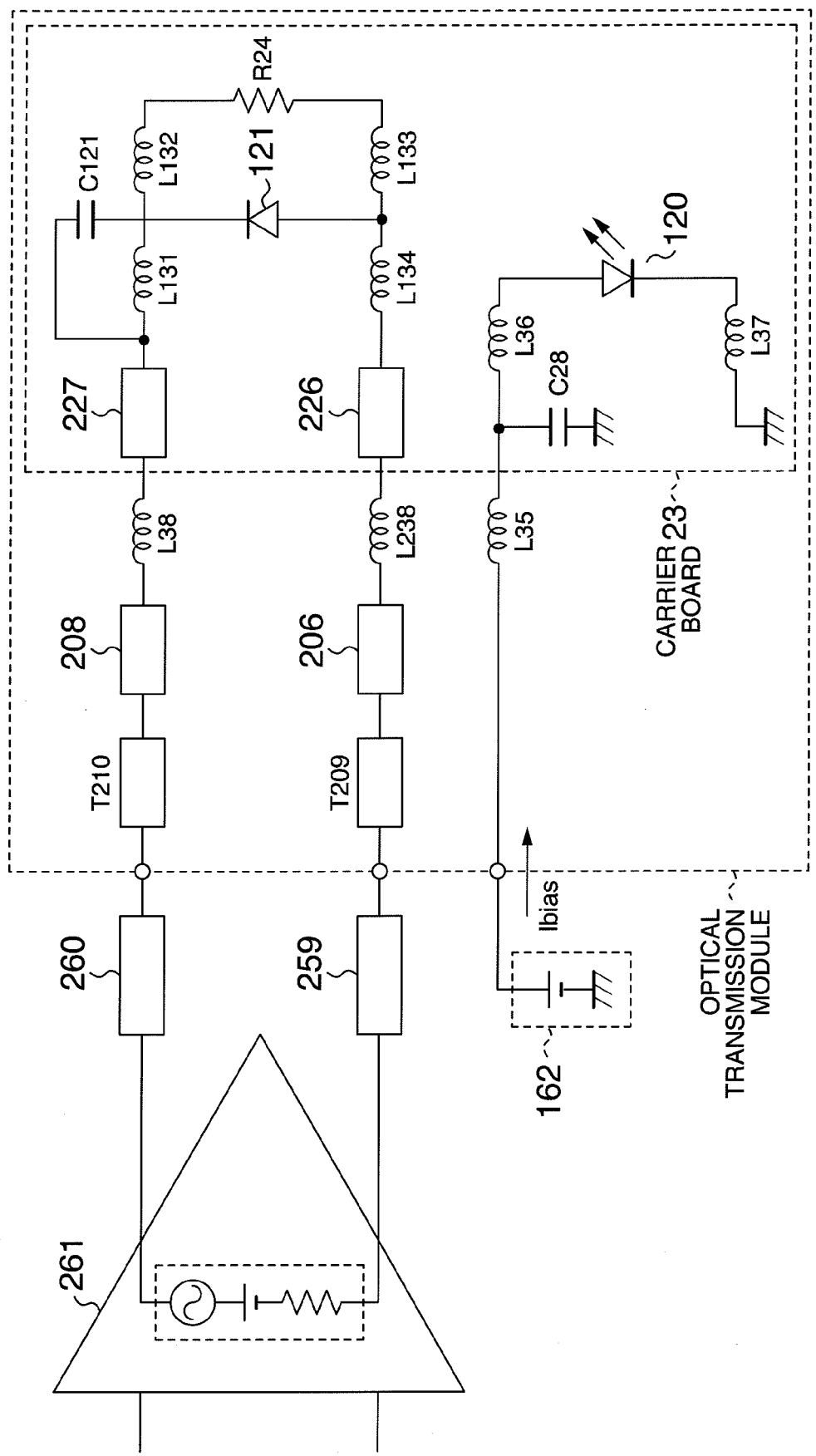
FIG. 8 is a main circuit diagram of the optical transmission module according to Embodiment 3 of the invention.

FIG. 7 is a structural view that shows main portions of an optical transmission module according to this embodiment. FIG. 8 is a main circuit diagram of the optical transmission module. The main difference from the second embodiment described above resides in that the optical modulator element 21 is driven by differential electric modulation signals.

The construction of the optical transmission module will be first explained with reference to FIG. 7. The optical transmission module uses a CAN type package casing as its casing. Reference numeral 1 denotes a metal stem and reference numeral 2 denotes a metal seat for mounting a main portion. Circular cylindrical lead pins 3 and 4 are provided to the metal stem 1 through through-holes 209 and 210 and are fixed by sealing glass 5. Relay boards 205 and 207 and a carrier board 223 are mounted onto the metal seat 2. A transfer line 206 is disposed on the relay board 205 and a transfer line 208, on the relay board 207.

A resistance element 24, a ground electrode 225, a first input transfer line 227 and a second input transfer line 226 are disposed on a surface of the carrier board 223 and the ground electrode 225 is connected to a back electrode of the carrier board 223 through a via-hole 26. A semiconductor chip 122 and a bypass capacitor 28 are mounted to the carrier board 223. The semiconductor chip 223 is an optical modulator integrated laser chip including a semiconductor laser diode element 120 and an optical modulator element 121 that are formed on a surface of a semi-insulating semiconductor wafer.

A continuous laser beam outputted from the semiconductor laser diode element 120 passes through the optical modulator element 121 and is then allowed to outgo to an optical fiber through a coupling lens (not shown in the drawing). The optical modulator element 121 modulates the continuous laser beam to optical modulation signals by electrical modulation signals having a bit rate of about 10 Gbit/s from an external driving IC. A monitor photo diode 6 is disposed on the metal stem 1 and is fixed at a position at which it can receive back output light of the semiconductor laser diode element 120.

A first bonding wire 131 connects a pattern electrode of a first input transfer line 227 to a cathode electrode of the optical modulator element 121 and a second bonding wire 132 connects cathode electrode of the optical modulator element 121 to one of the ends of the resistor element 24. A third bonding wire 133 connects the other end of the resistor element 24 to an anode electrode of the optical modulator element 121 and fourth bonding wire 134 connects an anode electrode of the optical modulator element 121 to a pattern electrode of the second input transfer line 226. The first input transfer line 227 on the carrier board 223 and the transfer line 208 on the relay board 207 are mutually connected to achieve low inductance through a plurality of bonding wires (or ribbon wires) 38.

Similarly, the second input transfer line 226 on the carrier board 223 and the transfer line 206 on the relay board 205 are mutually connected to achieve a low inductance through a plurality of bonding wires (or ribbon wires) 238. The transfer line 208 and the lead pin 3, and the transfer line 206 and the lead pin 4 are bonded by AuSn alloy, or the like. In this way are constituted electric signal input lines from the lead pin 3 and the lead pin 4 to the optical modulator element 21.

The semiconductor laser diode element 120 connects the cathode electrode to the ground electrode 225 through the bonding wire 37 and the anode electrode, to other lead pin (not shown in the drawings) through the bonding wires 35 and 36. A forward DC current is supplied to the laser diode element 120 as an external positive power source is connected to the lead pin. The output of the monitor photo diode 6 is outputted outside through other lead pin (not shown in the drawings).

A TO-56 type casing having a diameter of 5.6 mm, for example, is used as the CAN type package casing. Iron that is economical is suitable for reducing the cost when it is used as a material of the metal stem 1 and the metal seat 2. A dielectric material such as alumina or aluminum nitride is used for forming the relay boards 205 and 207 and the carrier board 223. When aluminum nitride having a high heat transfer rate is used for the carrier board 223, the heat resistance from the semiconductor chip 122 to the metal seat 2 can be lowered and the temperature rise of the elements can be appropriately suppressed.

The carrier board 223 may well be constituted by a bonded board of a dielectric board such as aluminum nitride and a metal sheet such as copper-tungsten and according to this construction, the heat resistance can be further lowered. The resistor element 24 is constituted by a tantalum nitride film and its resistance value is adjusted to 50 Ohms by laser trimming. The size can be suitably reduced when a parallel sheet type chip capacitor of a single-layered high dielectric board is used for the bypass capacitor 28.

Next, the circuit construction will be explained with reference to FIG. 8. The electric modulation signal outputted by the differential driving IC 261 is inputted to the first input transfer line 227 and the second input transfer line 226 of the carrier board through external transfer lines 250 and 260, a coaxial line T209 constituted by the through-hole 209, the lead pin 4 and the sealing glass 5, a coaxial line T210 constituted by the through-hole 210, the lead pin 3 and the sealing glass 5, a transfer line 206 on the relay board 205, the inductance L238 of the bonding wire 238 and inductance L38 of the bonding wire 38. The differential output impedance of the output of the driving IC 261 is set to 50 Ohms.

The transfer lines 259 and 260 are constituted by the transfer line on the printed board for mounting the differential driving IC 261 and the transfer line on the flexible board for connecting the printed board and the lead pins 3 and 4 and the characteristic impedance is set to 25 Ohms. The characteristic impedance of each of the coaxial lines T209 and 210 is set to 20 Ohms and the characteristic impedance of each of the transfer lines 206 and 207 and the first and second input transfer lines 227 and 226 is set to 25 Ohms. Symbol R24 represents the resistance of the resistance element 24. Symbols L131, L132, L1133 and L34 respectively represent inductances of the first, second, third and fourth bonding wires 131, 132, 133 and 134. The electric modulation signal is inputted across the anode electrode and the cathode electrode of the optical modulator element 121 through these circuit elements. Symbol C121 represents a parasitic capacitance that occurs between the cathode electrode of the optical modulator element 121 and the back electrode.

On the other hand, the forward DC current Ibias is supplied to the semiconductor laser diode element 120 from the external current driving circuit 162 to let it output a laser beam. Here, symbol L35, L36 and L37 respectively represent the inductances of the bonding wires 35, 36 and 37 and symbol C28 does the capacitance of the bypass capacitor 28. Because the optical modulator element 121 is generally operated by applying a backward bias voltage, this embodiment uses a single positive power source such as +5.0 V for the driving IC 261 and the current driving circuit 162.

The cathode electrode of the optical modulator element 121 is connected to the conductive n type layer that is positioned in the lowermost layer among the element conductor layers. Therefore, when the parasitic capacitance occurring between the cathode electrode and the back electrode is suppressed to the minimum level, too, the capacitance C121 between the cathode electrode and the back electrode is greater than the capacitance between the anode electrode and the back electrode. In this embodiment 2, the back electrode of the optical modulator element 121 is connected to the first input transfer line 227 and the cathode electrode is connected to the first input transfer line 227 through the first bonding wire 131. In this way, the degradation of performances of the circuit operation resulting from the capacitance C121 between the cathode electrode and the back electrode can be suppressed to minimum and excellent optical transmission module characteristics can be suitably acquired.

In this embodiment, the signal line from the differential driving IC 261 to the optical transmission module is the differential transfer lines. Therefore, this circuit construction is suitable for reducing the cross-talk from the transmission portion to the reception portion inside the optical transceiver and the electromagnetic interference (EMI) to the outside of the optical transceiver. In addition, in comparison with the case where the optical modulator element is driven by using only one of the outputs of the driving IC (single ended driving), the voltage amplitude capable of driving the optical modulator element can be increased substantially double and an extinction ratio of the optical output signal can be effectively improved.

As a modified embodiment, it is also possible to insert a bias tee into each of the differential lines between the differential driving IC 261 and the optical transmission module and to apply the backward bias voltage to the optical modulator element 121 by using another DC voltage source. In such a case, the differential driving IC 261 needs to drive only the voltage amplitude component of the electric modulation signal. In consequence, the operation can be made by use of a lower voltage power source and the power consumption can be further reduced.

The characteristic impedances of the transfer lines 259 and 260 are 25 Ohms, respectively, but it is also possible to form one pair of differential transfer lines by these two lines and to set the differential impedance to 20 Ohms. The characteristic impedances of the coaxial lines T209 and T210 are set to 20 Ohms but may be changed within the range of 20 to 30 Ohms, for example, by selecting the shapes of the members and the material for the glass material. Furthermore, though the resistance value of the resistance element 24 is set to 50 Ohms, it may be changed within the range of 40 to 60 Ohms, for example, depending on compatibility with the differential driving IC actually mounted to the transceiver.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical transmission module using a carrier board to which an optical modulator integrated laser element having an optical modulator equipped with an anode electrode and a cathode electrode on a surface of an element and a semiconductor laser is mounted and in which a ground electrode and a pattern electrode of an input transfer line for inputting an electric signal to said optical modulator are formed on a surface of said board, comprising:
   a first bonding wire for connecting the pattern electrode of said input transfer line and the anode electrode of said optical modulator;
   a second bonding wire for connecting the anode electrode of said optical modulator and a first electrode of said terminal resistor;
   a third bonding wire for connecting the cathode electrode of said optical modulator and a second electrode of said terminal resistor; and
   a fourth bonding wire for connecting the cathode electrode of said optical modulator and said ground electrode.

2. An optical transmission module according to claim 1, wherein a joint portion of said first bonding wire and the pattern electrode of said input transfer line and a joint portion of said fourth bonding wire and said ground electrode are positioned on both sides interposing said optical modulator integrated laser element between them.

3. An optical transmission module according to claim 1, wherein said optical modulator is arranged on said ground electrode or on the pattern electrode of said input transfer line.

4. An optical transmission module according to claim 1, wherein said second bonding wire and said third bonding wire are arranged adjacent to, and substantially in parallel with, each other.

5. An optical transmission module according to claim 1, wherein a bit rate of said electric signal is from 9.95 Gbit/s to 11.3 Gbit/s.

6. An optical transmission module according to claim 1, wherein a semiconductor laser and an optical modulator element of said optical modulator integrated laser element are driven by a power source having a single polarity.

7. An optical transmission module using a carrier board to which an optical modulator integrated laser element having an optical modulator equipped with an anode electrode and a cathode electrode on a surface of an element and a semiconductor laser is mounted and in which a ground electrode, a pattern electrode of an input transfer line for inputting an electric signal to said optical modulator and a terminal resistor for the electric signal inputted are formed on a surface of said board, comprising:

a first bonding wire for connecting the pattern electrode of said input transfer line and the cathode electrode of said optical modulator;

a second bonding wire for connecting the cathode electrode of said optical modulator and a first electrode of said terminal resistor;

a third bonding wire for connecting the anode electrode of said optical modulator to a second electrode of said terminal resistor; and a fourth bonding wire for connecting the anode electrode of said optical modulator and said ground electrode.

8. An optical transmission module according to claim 7, wherein a joint portion of said first bonding wire and the pattern electrode of said input transfer line and a joint portion of said fourth bonding wire and said ground electrode are positioned on both sides interposing said optical modulator integrated laser element between them.

9. An optical transmission module according to claim 7, wherein said optical modulator is arranged on said ground electrode or on the pattern electrode of said input transfer line.

10. An optical transmission module according to claim 7, wherein said second bonding wire and said third bonding wire are arranged adjacent to, and substantially in parallel with, each other.

11. An optical transmission module according to claim 7, wherein a bit rate of said electric signal is from 9.95 Gbit/s to 11.3 Gbit/s.

12. An optical transmission module according to claim 7, wherein a semiconductor laser and an optical modulator element of said optical modulator integrated laser element are driven by a power source having a single polarity.

13. An optical transmission module using a carrier board to which an optical modulator integrated laser element having an optical modulator equipped with an anode electrode and a cathode electrode on a surface of an element and a semiconductor laser is mounted and in which a ground electrode, a pattern electrode of a first input transfer line for inputting differential electric signals to said optical modulator, a pattern electrode of a second transfer line and a terminal resistor for the electric signals inputted to said first transfer line and said second transfer line are formed on a surface of said board, comprising:

a first bonding wire for connecting the pattern electrode of said first input transfer line and the cathode electrode of said optical modulator;

a second bonding wire for connecting the cathode electrode of said optical modulator and a first electrode of said terminal resistor;

a third bonding wire for connecting the anode electrode of said optical modulator to a second electrode of said terminal resistor; and a fourth bonding wire for connecting the anode electrode of said optical modulator and said pattern electrode of said second input transfer line.

14. An optical transmission module according to claim 13, wherein a joint portion of said first bonding wire and the pattern electrode of said first input transfer line and a joint portion of said fourth bonding wire and said ground electrode are positioned on both sides interposing said optical modulator integrated laser element between them.

15. An optical transmission module according to claim 13, wherein said optical modulator is arranged on the pattern electrode of said first transfer line or on the pattern electrode of said second input transfer line.

16. An optical transmission module according to claim 13, wherein said second bonding wire and said third bonding wire are arranged adjacent to, and substantially in parallel with, each other.

17. An optical transmission module according to claim 13, wherein a bit rate of said electric signal is from 9.95 Gbit/s to 11.3 Gbit/s.

18. An optical transmission module according to claim 13, wherein a semiconductor laser and an optical modulator element of said optical modulator integrated laser element are driven by a power source having a single polarity.

* * * * *